United States Patent
Chawla

(10) Patent No.: US 11,546,709 B2
(45) Date of Patent: Jan. 3, 2023

(54) AUDIO PLAYBACK UNDER SHORT CIRCUIT CONDITIONS

(71) Applicant: TEXAS INSTRUMENTS INCORPORATED, Dallas, TX (US)

(72) Inventor: Mohit Chawla, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 111 days.

(21) Appl. No.: 16/939,376

(22) Filed: Jul. 27, 2020

(65) Prior Publication Data

US 2021/0092540 A1 Mar. 25, 2021

Related U.S. Application Data

(60) Provisional application No. 62/904,122, filed on Sep. 23, 2019.

(51) Int. Cl.
| | |
|---|---|
| H04R 29/00 | (2006.01) |
| H02M 3/156 | (2006.01) |
| H04R 3/00 | (2006.01) |
| G01R 31/52 | (2020.01) |
| G01R 31/28 | (2006.01) |
| G01R 31/26 | (2020.01) |

(52) U.S. Cl.
CPC ....... H04R 29/001 (2013.01); G01R 31/2621 (2013.01); G01R 31/2825 (2013.01); G01R 31/52 (2020.01); H02M 3/156 (2013.01); H04R 3/00 (2013.01)

(58) Field of Classification Search
CPC ......... H03F 3/38; H03F 3/217; H04R 29/001; H04R 3/00; H04R 29/00
USPC .......................................... 381/58, 120, 55
See application file for complete search history.

(56) References Cited

U.S. PATENT DOCUMENTS

| | | | |
|---|---|---|---|
| 5,805,020 A | 9/1998 | Danz et al. | |
| 7,336,794 B2* | 2/2008 | Furst | H04R 3/00 330/10 |
| 7,616,458 B2 | 11/2009 | Motoyui | |
| 7,847,632 B2* | 12/2010 | Ikejiri | G01R 31/52 330/207 P |
| 7,965,138 B2* | 6/2011 | Teplechuk | H03F 3/217 330/10 |

(Continued)

FOREIGN PATENT DOCUMENTS

| | | |
|---|---|---|
| CN | 103036494 | 4/2013 |
| CN | 107834985 | 3/2018 |

OTHER PUBLICATIONS

Class D Amplifier Design Basics II. IR International Rectifier, [on-line] Feb. 19, 2009, Retrieved on Internet: <URL:http://www.irf.com/product-info/audio/classdtutorial2.pdf> (74 pages).

(Continued)

*Primary Examiner* — Disler Paul
(74) *Attorney, Agent, or Firm* — John R. Pessetto; Frank D. Cimino

(57) ABSTRACT

An audio system includes an H-bridge. The audio system implements one or more techniques for ensuring a transistor within the H-bridge does not turn on in the event of the detection of a short-circuit on the output of the H-bridge. Other transistors within the H-bridge can turn and thus audio can still be played to a speaker.

16 Claims, 8 Drawing Sheets

(56) References Cited

U.S. PATENT DOCUMENTS

| | | | |
|---|---|---|---|
| 8,159,299 B2* | 4/2012 | Gribben | H03F 1/305 330/251 |
| 8,384,478 B2 | 2/2013 | Nussbaum et al. | |
| 8,749,303 B2* | 6/2014 | Amadi | H03F 1/523 330/10 |
| 9,019,012 B2* | 4/2015 | Lesso | H03F 3/217 330/10 |
| 9,025,791 B2 | 5/2015 | Seedher et al. | |
| 9,628,040 B2* | 4/2017 | Lesso | H03F 3/2175 |
| 10,219,090 B2* | 2/2019 | Adams | H04R 3/007 |
| 11,121,690 B2* | 9/2021 | Lesso | H03F 1/26 |
| 2013/0223652 A1 | 8/2013 | Sahandiesfanjani et al. | |
| 2018/0076781 A1 | 3/2018 | Koyama | |

OTHER PUBLICATIONS

International Search Report in corresponding PCT Patent Application No. PCT/US2020/052131, dated Dec. 24, 2020 (2 pages).
Supplemental European Search Report in corresponding European Patent Application No. 20869610.4, dated Oct. 21, 2022, 13 pgs.

* cited by examiner

AUDIO PLAYBACK UNDER SHORT CIRCUIT CONDITIONS

CROSS-REFERENCE TO RELATED APPLICATIONS

This application claims priority to U.S. Provisional Application No. 62/904,122, filed Sep. 23, 2019, which is hereby incorporated by reference.

BACKGROUND

Many audio output systems include a class-D amplifier configured to drive a speaker. A class-D amplifier includes transistors that are configured to alternate between coupling a supply and a ground to an output. Audio systems that include class-D amplifiers are often integrated into telecommunications equipment such as telephones, etc. In some examples, this telecommunications equipment is integrated into a vehicle, such as an automobile. The audio system that includes the class-D amplifier may be configured to output audio associated with a telecommunications session, such as a phone call.

During operation of an audio system including a class-D amplifier, a short circuit condition may occur in which one of the output terminals of the class-D amplifier is short-circuited to the ground or the supply. In response to such a condition, many audio systems are configured to disable audio output. However, disabling audio altogether may be unsuitable in some situations. For example, disabling audio output of a telecommunications device in an emergency situation, such as after an automobile accident, may be undesirable.

SUMMARY

An audio system includes an H-bridge. The audio system implements one or more techniques for ensuring a transistor within the H-bridge does not turn on in the event of the detection of a short-circuit on the output of the H-bridge. Other transistors within the H-bridge can turn and thus audio can still be played to a speaker.

In one example, an audio system includes a modulator having an input and an output and an H-bridge having an input and an output. The output of the modulator is coupled to the input of the H-bridge. A load diagnostics circuit is included that has an input and a first control output. A direct current (DC) add circuit is included having an input and an output. The output of the DC add circuit is coupled to the input of the modulator, and the first control output from the load diagnostics circuit is coupled to the DC add circuit.

Another example includes an audio system including a modulator having an input and an output and an H-bridge having an input and an output. A load diagnostics circuit is included having an input and a first control output. A signal masking circuit is coupled between the output of the modulator and the input of the H-bridge. The signal masking circuit includes a control input coupled to the first control output of the load diagnostics circuit.

In a further example, an audio system includes a modulator having an input and an output and an H-bridge having an input and an output. A short-circuit feedback circuit has an input and an output, and the input of the short-circuit feedback circuit is coupled to the output of the modulator. A first switch is coupled between the output of the short-circuit feedback circuit and the input of the modulator. A second switch is coupled between the output of the H-bridge and the input of the modulator. A load diagnostics circuit has an input coupled to the output of the H-bridge. The load diagnostics circuit is configured to control operational states of the first and second switches.

BRIEF DESCRIPTION OF THE DRAWINGS

For a detailed description of various examples, reference will now be made to the accompanying drawings in which.

DETAILED DESCRIPTION

Audio devices that incorporate a class-D amplifier and support audio output under short-circuit conditions are disclosed. A telecommunication device utilizing the disclosed principles may continue to provide audio output even under short-circuit conditions. Accordingly, the telecommunication device may support emergency calls even when the telecommunication device is experiencing a short-circuit condition. The quality of the audio may be impaired due to the short-circuit condition but may be sufficient for emergency or other situations.

Figure 1:
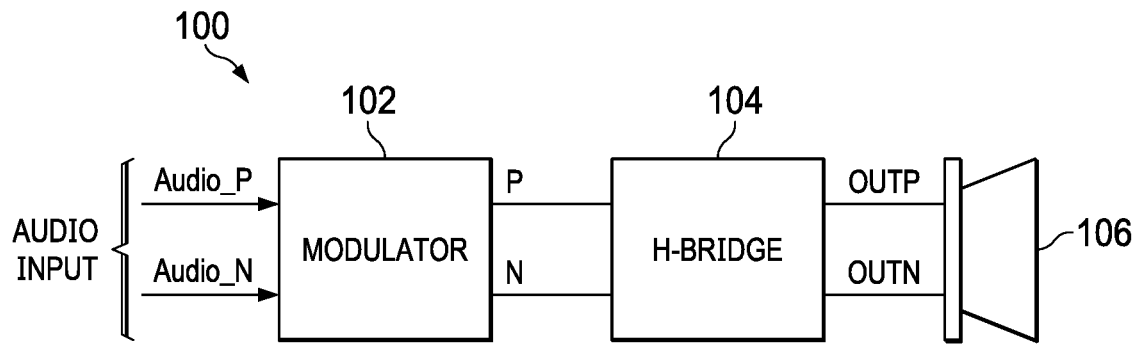
FIG. 1 illustrates an example of an audio system including a class-D amplifier.

FIG. 1 illustrates at least a portion of an audio system 100. The audio system 100 includes a modulator 102, an H-bridge 104, and a speaker 106. The modulator 102 receives a differential audio input signal comprising Audio_P and Audio_N. The modulator 102 generates output pulse width modulated signals P and N, which are coupled to the H-bridge 104. The H-bridge 104 includes multiple transistor switches and includes output terminals coupled to the speaker 106. The output terminals provide the signal labeled OUTP and OUTM.

Figure 2:
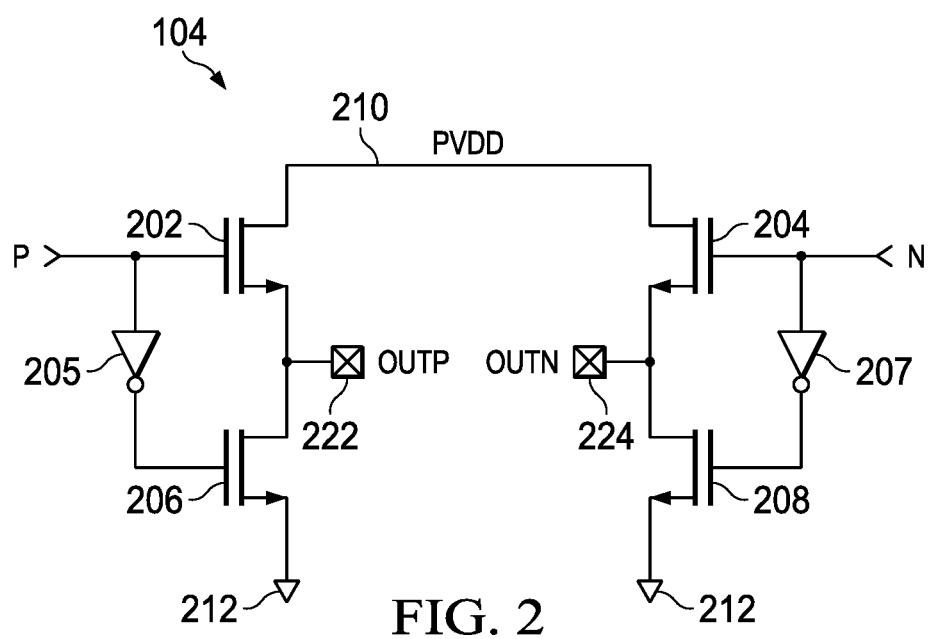
FIG. 2 illustrates an example of an H-bridge for use in a class-D amplifier.

FIG. 2 shows an example of H-bridge 104. In this example, H-bridge 104 includes transistors 202, 204, 206, and 208. In the example of FIG. 2, transistors 202-208 comprise N-type metal oxide semiconductor field effect transistors (NMOS) but can be implemented as other types of transistors. A drain of transistor 202 is coupled to a power supply terminal 210 (PVDD) and a source of transistor 202 is coupled to a first output node 222 (OUTP) and to a drain of transistor 206. A source of transistor 206 is coupled to a ground 212. The gate of transistor 202 receives the P signal from modulator 102 and the gate of transistor 206 receives an inverted control signal (via inverter 205). As such, when P is logic high, transistor 202 is on and transistor 206 is off, and when P is logic low, transistor 202 is off and transistor 206 is on. The drain of transistor 204 is also coupled to the power supply terminal 210 (PVDD) and the source of transistor 204 is coupled to a second output node 224 (OUTN) and to the drain of transistor 208. The source of transistor 208 is coupled to the ground 212. The gate of transistor 204 receives the N signal from the modulator and the gate of transistor 108 receives the logical inverse of N (via inverter 207).

A load (such as speaker 106) may be connected between the first output node 222 and the second output node 224 of H-bridge 104. Transistors 202-208 operate as switches (on or off). During normal operation (i.e., no short-circuit conditions), the P and N signals from the modulator 102 cause transistors 202-208 to be configured in any of the following modes: transistors 202 and 208 are on while transistors 204 and 206 are off, transistors 204 and 206 are on while transistors 202 and 208 are off, or transistors 206 and 208 are on, while transistors 202 and 204 are off. At no time should both transistors on one side of the H-bridge be on. That is, transistors 202 and 206 should never be on at the same time. Similarly, transistors 204 and 208 should never be on at the same time. If both transistors on one side of the H-bridge 104 were on at the same time, the supply voltage terminal 210 would effectively be shorted to ground 212.

Unfortunately, shorts may occur within the H-bridge 104. For example, output node 222 (OUTP) may be shorted to ground 212 or to the supply voltage terminal 210. Similarly, output node 224 (OUTN) may be shorted to ground 212 or to the supply voltage terminal 210. If OUTP was inadvertently shorted to ground, a short-circuit condition would occur if transistor 202 was turned on. If OUTP was shorted to the supply voltage terminal 210, a short-circuit condition would occur if transistor 206 was turned on. Similarly, if OUTN was shorted to ground, a short-circuit condition would occur if transistor 204 was turned on, and if OUTN was shorted to the supply voltage terminal 210, a short-circuit condition would occur if transistor 208 was turned on.

In such short-conditions conditions, some audio systems may respond by disabling the audio amplifier altogether to prevent a battery (e.g., an automobile battery) that supplies power to the audio system (to the supply voltage terminal 210) from draining and to prevent damage to other devices and electronics that share the power supply terminal 210. However, shutting down the audio system will prevent any audio at all from through speaker 106. Cessation of all audio may be undesirable in various situations, such emergencies. The examples described herein permit at least some audio to play through speaker 106 despite the presence of a short on one of the H-bridge output nodes 222, 224.

Figure 3:
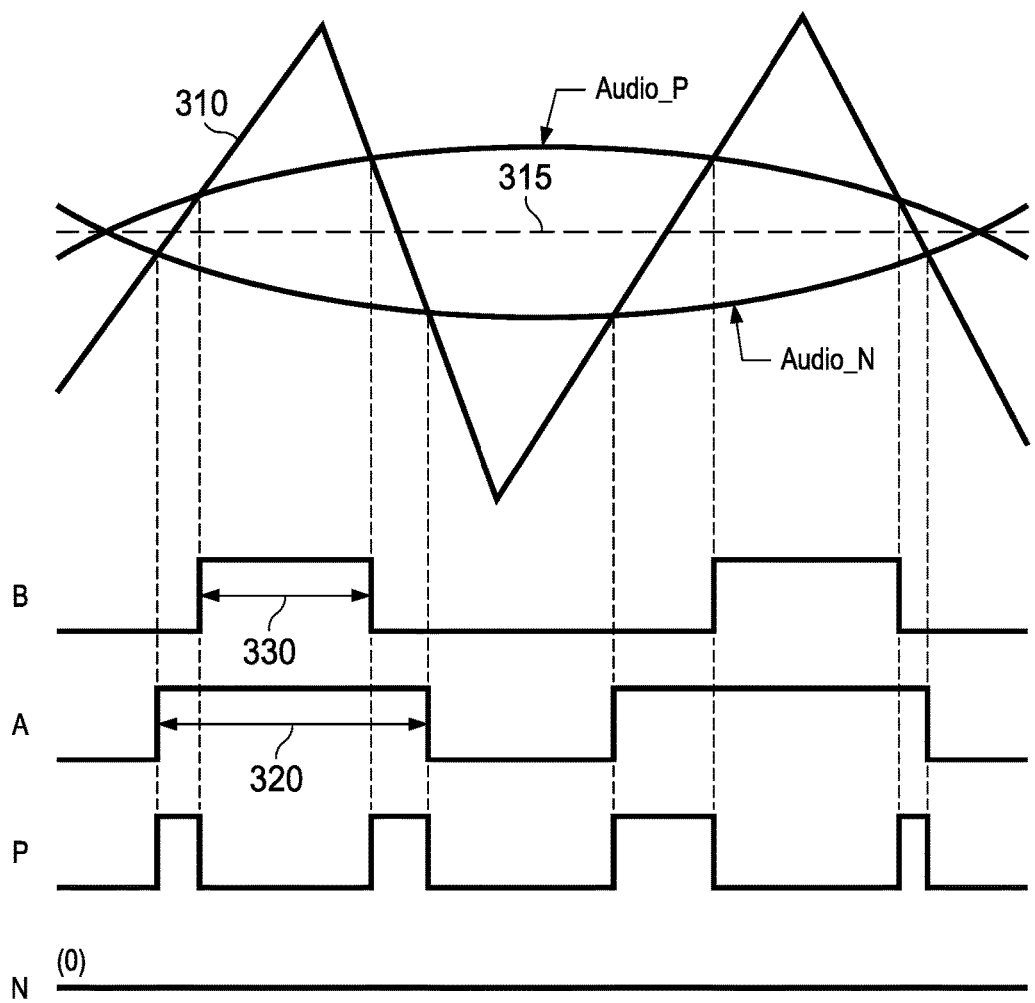
FIG. 3 shows a timing diagram of signals within a modulator of a class-D amplifier.

FIG. 3 is a timing diagram illustrating the operation of the modulator 102 when no short-circuit is present on an output node of the H-bridge 104. The differential audio signal is shown as Audio_P and Audio-N. Audio_P and Audio_N may be digital signals. The audio signal is encoded as the difference between Audio_P and Audio_N. Dashed line 315 represents the common mode voltage level of Audio_P and Audio_N. The modulator 102 implements, or receives, a ramp signal 310. The modulator also includes a comparator which generates an output signal B based on a comparison of Audio_P to ramp signal 310 and an output signal A based on a comparison of Audio_N to ramp signal 310. When ramp signal 310 is greater than Audio_P, B is high, and B is low otherwise. Similarly, when ramp signal 310 is greater than Audio_N, A is high, and A is low otherwise. Other logic (shown and discussed below) within modulator 102 generates the P and N signals. In the example of FIG. 3, Audio_N is more positive than Audio P (a negative audio signal), and thus the width of the A pulses 320 is larger than the width of the B pulses 330. The P signal is determined as A-B when A-B is greater than 0, otherwise P is 0. As such, P is high when A is high and B is low, and P is low otherwise. The N signal is determined as B-A when B-A is greater than 0, otherwise N is 0. As such, N is high when B is high and A is low, and N is low otherwise. In FIG. 3, because B is not high when A is low, N remains at logic low.

FIG. 3 thus illustrates that P pulses on and off as shown and N remains low. Referring briefly to FIG. 2, with P pulsing on and off, transistor 202 is also pulsed on and off. Transistor 202 is turned on when P is high and off when P becomes low. Transistor 206 toggles on and off reciprocal to transistor 202 such transistors 202 and 206 are not on at the same time. With N low, however, transistor 204 remains off and transistor 208 remains on. FIG. 3 shows an example of a negative audio signal (Audio_P is less than Audio_N). For a positive audio signal (Audio_P is greater than Audio_N), the timing of the signals is similar, but the N signal pulses on and off while P remains low.

Figure 4:
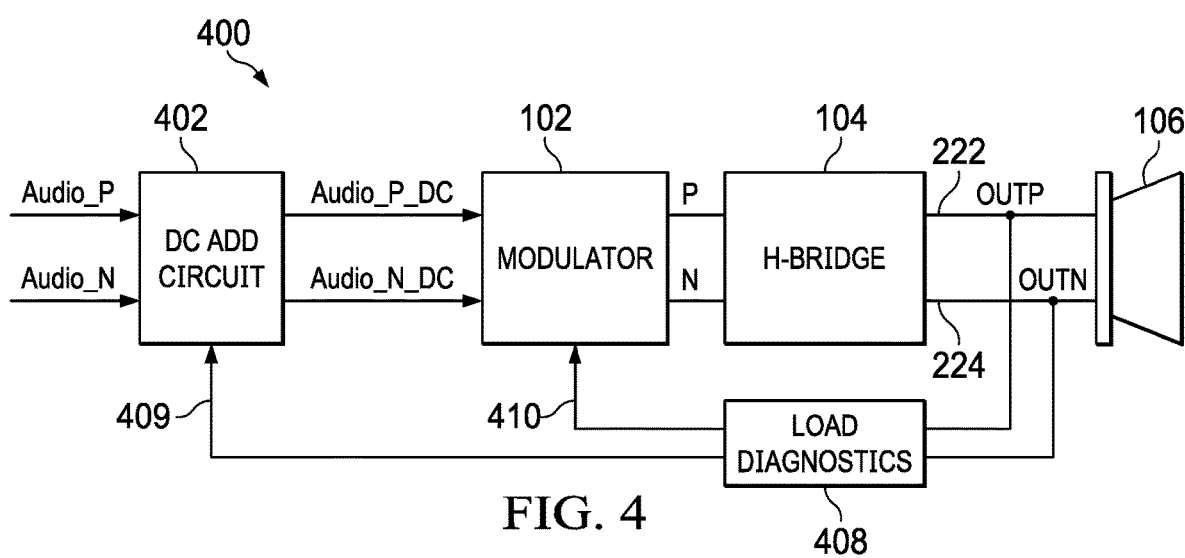
FIG. 4 illustrates an example of an audio system that includes a class-D amplifier and a direct current (DC) add circuit to permit the audio system to continue playing audio in the face of a short-circuit of one of the output terminals of the H-bridge.
Figure 11:
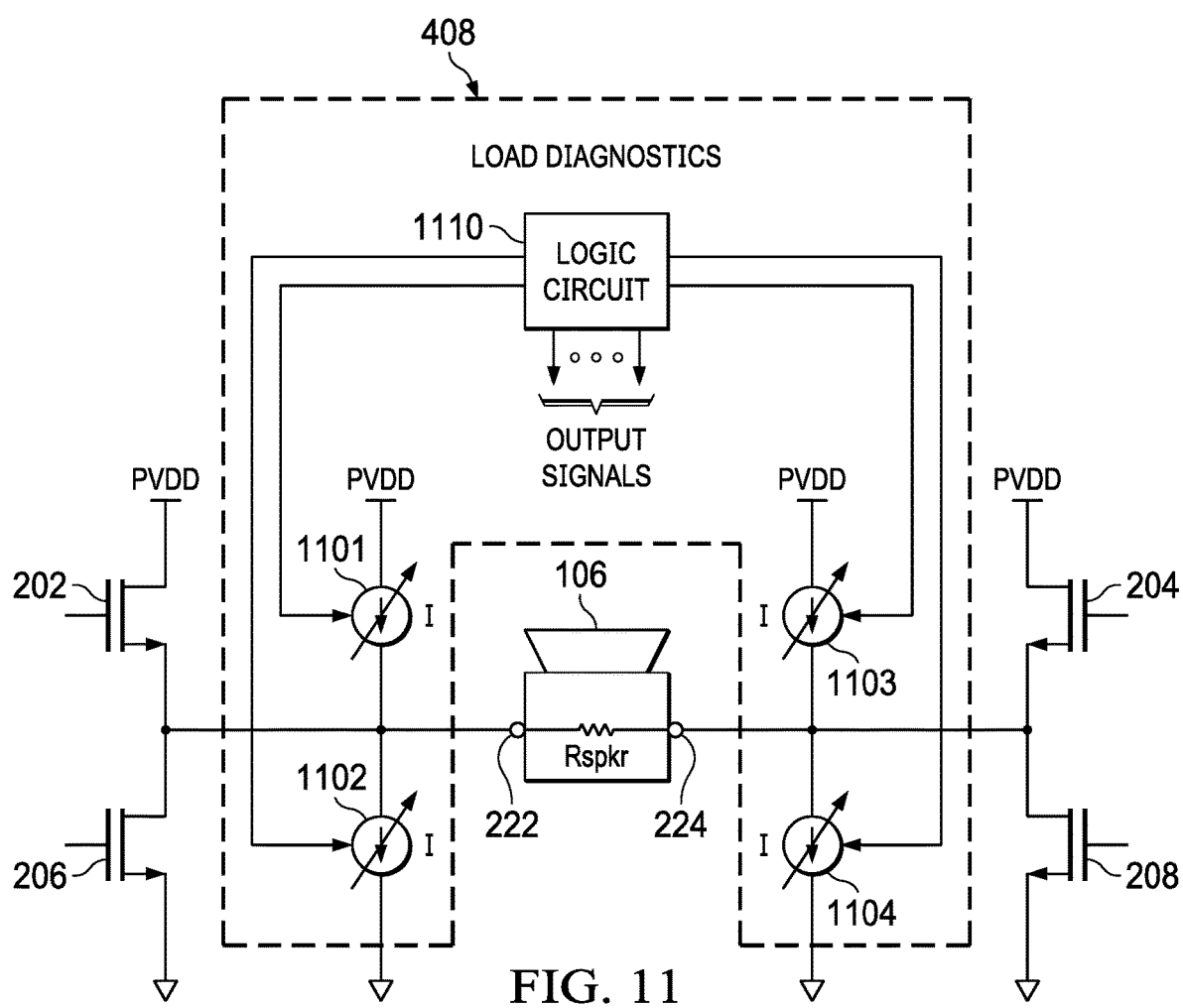
FIG. 11 shows an example implementation of a load diagnostics circuit to detect the presence of a short-circuit on the output of the audio amplifier.

FIG. 4 shows an example of an audio system 400 that includes modulator 102, H-bridge 104, and speaker 106. The audio system 400 also includes a load diagnostics circuit 408 and a direct current (DC) add circuit 402. The load diagnostics circuit 408 monitors the output nodes 222 and 224 of the H-bridge 104 to detect if either of the output nodes 222 or 224 is shorted to ground or to the supply voltage terminal. The output signal 409 indicates whether or not a short-circuit condition has been detected and whether the DC add circuit 402 is to add a DC value (positive or negative) to the audio signal. Control signal 410 is coupled to the modulator 102 and is used to control multiplexers within the modulator as explained below. FIG. 11 shows an example implementation of a load diagnostics circuit 408 and is described below.

Figure 5:
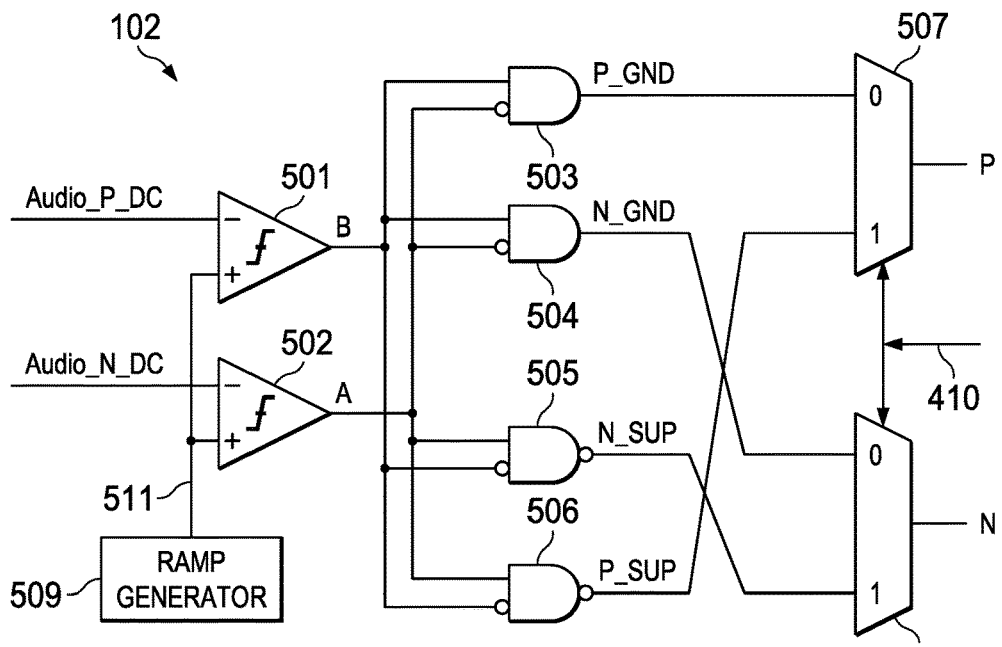
FIG. 5 illustrates an example of a modulator for use with the class-D amplifier.
Figure 6:
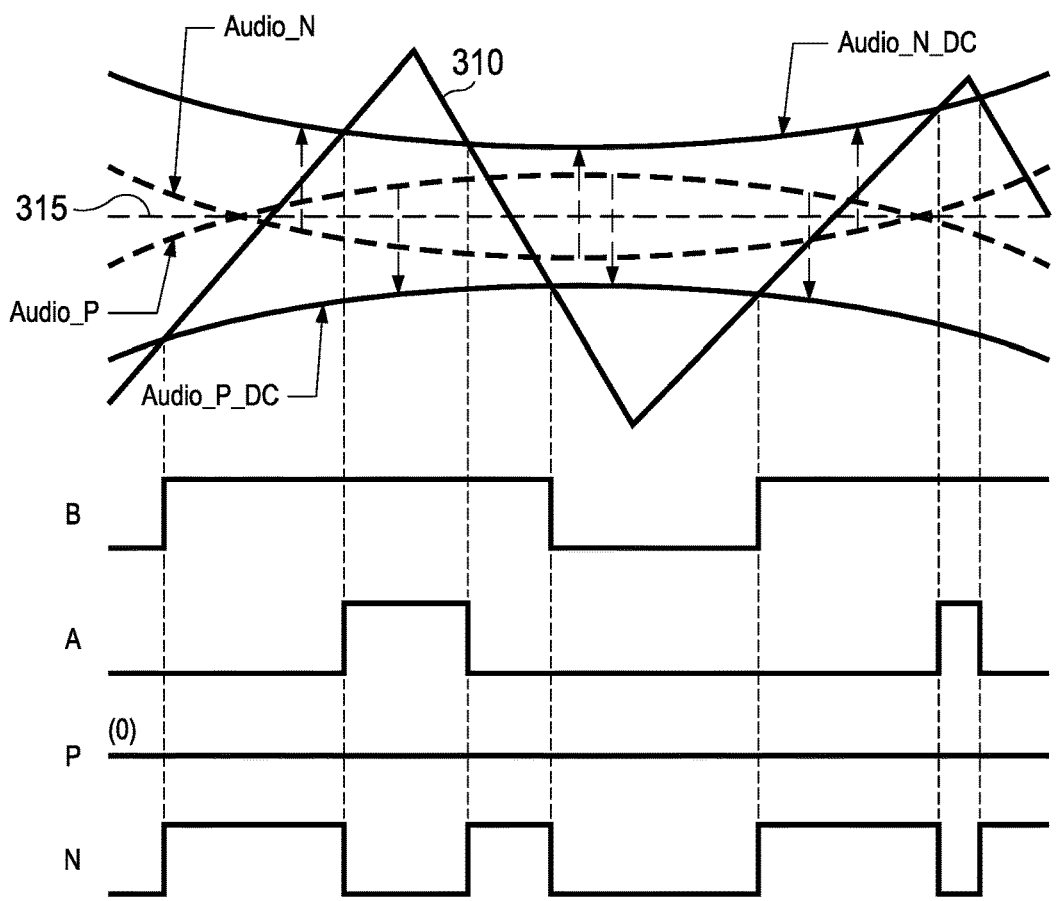
FIG. 6 is a timing diagram illustrating adding negative DC to the audio signal upon the detection of certain types of short-circuits.
Figure 7:
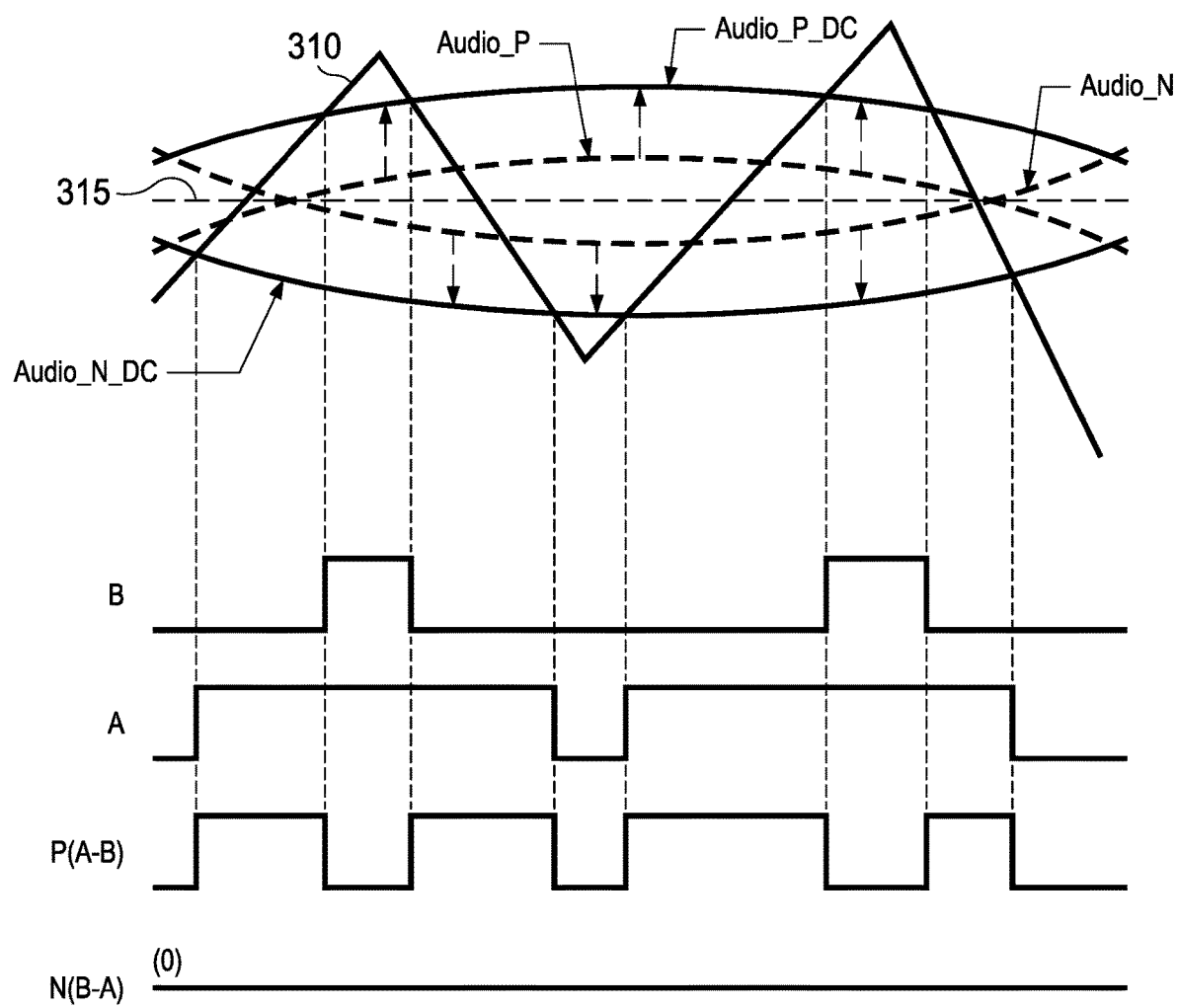
FIG. 7 is a timing diagram illustrating adding positive DC to the audio signal upon the detection of other types of short-circuits.

The DC add circuit 402 has inputs that receive Audio_P and Audio_N and the output signal 409 from the load diagnostics circuit 408. The output signals from the DC add circuit 402 include Audio_DC_P and Audio_DC_N. The DC add circuit 402 may be implemented as a digital summer to either add a positive value to the audio signal (the audio signal being the difference between Audio_P and Audio_N) or add a negative value to the audio signal. Neither a positive nor negative value is added to the audio signal if no short-circuit condition is detected by the load diagnostics, and thus Audio_DC_P is equal to Audio_P, and Audio_DC_N is equal to Audio_DC_N. A positive or negative value is added, however, to the audio signal. Whether a positive or negative value is added to the audio signal is a function of the type of short-circuit condition detected by the load diagnostics circuit 408. A positive value is added if the load diagnostics circuit 408 detects that either OUTP is shorted to the supply voltage terminal or OUTN is shorted to ground. A negative value is added if the load diagnostics circuit 408 detects that either OUTP is shorted to ground or OUTN is shorted to the supply voltage terminal. FIG. 5 provides an example implementation of modulator 102 and FIGS. 6 and 7 provide example timing diagrams illustrating the addition of negative and positive values to the audio signal.

In FIG. 5, the example modulator 102 includes comparators 501 and 502, a ramp generator 509, AND gates 503 and 504, NAND gates 505 and 506, and multiplexers 507 and 508. Audio_P_DC is provided to a negative input of comparator 501 and Audio_N_DC is provided to the negative input of comparator 502. Ramp generator 509 generates the ramp signal 310 which is provided to the positive inputs of comparators 501 and 502 to generate the A and B signals.

Each AND gate 503 and 504 and NAND gate 505 and 506 include a non-inverting and an inverting input as shown. The A signal is provided to the non-inverting inputs of AND gate 503 and NAND gate 505 and to the inverting inputs of AND gate 504 and NAND gate 506. Similarly, the B signal is provided to the inverting inputs of AND gate 503 and NAND gate 505 and to the non-inverting inputs of AND gate 504 and NAND gate 506. The output of AND gate 503 is a signal labeled P_GND. P_GND is only high when A is high and B is low, and otherwise P_GND is low. The output of AND gate 504 is a signal labeled N_GND. NM_GND is only high when B is high and A is low, and otherwise N_GND is low. The output of NAND gate 505 is a signal labeled N_SUP. N_SUP is only low when A is high and B is low, and otherwise N_SUP is high. The output of NAND gate 506 is a signal labeled P_SUP. P_SUP is only low when B is high and A is low, and otherwise P_SUP is high.

The 0-input of multiplexer 507 receives P_GND and the 1-input of multiplexer 507 receives P_SUP. The output of multiplexer 507 is the P signal to the H-bridge 104. The 0-input of multiplexer 508 receives N_GND and the 1-input of multiplexer 508 receives N_SUP. The output of multiplexer 508 is the N signal.

The control signal to the multiplexers 507 and 508 is the control signal 410 from the load diagnostics circuit 408. Responsive to the load diagnostics circuit detecting a short between OUTP and ground or between OUTN and ground, the control signal 410 is asserted to cause the multiplexers 507 and 508 to select their 0-inputs. Responsive to the load diagnostics circuit detecting a short between OUTP and the supply voltage terminal or between OUTN and the supply voltage r terminal ail, the control signal 410 is asserted to cause the multiplexers 507 and 508 to select their 1-inputs. When no short-circuit is detected, control signal 410 is asserted to cause the multiplexers 507 and 508 to select their 0-inputs.

If a short occurs between OUTP and ground, the modulator 102 should not permit transistor 202 to turn on. If a short occurs between OUTP and the supply voltage terminal 210, the modulator 102 should not permit transistor 206 to turn on. To prevent NMOS transistor 202 from turning on, modulator 102 forces the P signal to remain at a logic low level. To prevent NMOS transistor 206 from turning on, modulator 102 forces the P signal to remain at a logic high level. Similarly, if a short occurs between OUTN and ground, the modulator 102 should not permit transistor 204 to turn on. If a short occurs between OUTN and the supply voltage terminal 210, the modulator 102 should not permit transistor 208 to turn on. To prevent transistor 204 from turning on, modulator 102 forces the N signal to remain at a logic low level. To prevent transistor 208 from turning on, modulator 102 forces the N signal to remain at a logic high level.

FIG. 6 is a timing diagram illustrating how the system reacts to the presence of short-circuit detected by load diagnostics 408 between OUTP and ground. For that case, a negative DC value is added to the audio signal. Adding a negative DC value results in the difference between Audio_P and Audio_N being more negative. FIG. 6 illustrates that Audio_N is increased to a more positive level while Audio_P is made more negative. A large enough negative DC value is added such that Audio_N_DC and Audio_P_DC do not cross each other. The common mode level 315 of Audio_N_DC and Audio_P_DC does not change.

The resulting A and B comparator output signals are shown in FIG. 6 as well. The P signal remains at logic low because A-B is not greater than 0. However, the N signal pulses high and low as shown. With P being forced to remain low, transistor 202 cannot turn on and transistor 206 remains on. Transistor 204 pulses on and off in accordance with the N signal, and audio can be played (albeit at reduced quality) through the speaker.

FIG. 7 is a timing diagram illustrating how the system reacts to the presence of short-circuit detected by load diagnostics 408 between OUTN and ground. For that case, a positive DC value is added to the audio signal. Adding a positive DC value results in the difference between Audio_P and Audio_N being more positive. FIG. 7 illustrates that Audio_P is increased to a more positive level while Audio_N is made more negative. A large enough positive DC value is added such that Audio_P_DC and Audio_N_DC do not cross each other. The N signal remains at logic low because B-A is not greater than 0. However, the P signal pulses high and low as shown. With N being forced to remain low, transistor 204 cannot turn on and transistor 208 remains on. Transistor 202 pulses on and off in accordance with the P signal, and audio can be played (albeit at reduced quality) through the speaker.

FIGS. 6 and 7 illustrate the response to short-circuits between OUTP and ground and between OUTN and ground. In the case of a short-circuit between OUTP and the supply voltage terminal, the load diagnostics circuit 408 asserts signal 409 to the DC add circuit 402 to cause the DC add circuit 402 to add a positive value to the audio signal, and asserts control signal 410 to cause multiplexers 507 and 508 to select their 1-inputs. Similarly, for a short-circuit between OUTN and the supply voltage terminal, signals 409 and 410 are asserted to cause the DC add circuit 402 to add a negative DC value to the audio signal and to cause the multiplexers to select their 1-inputs.

Figure 8:
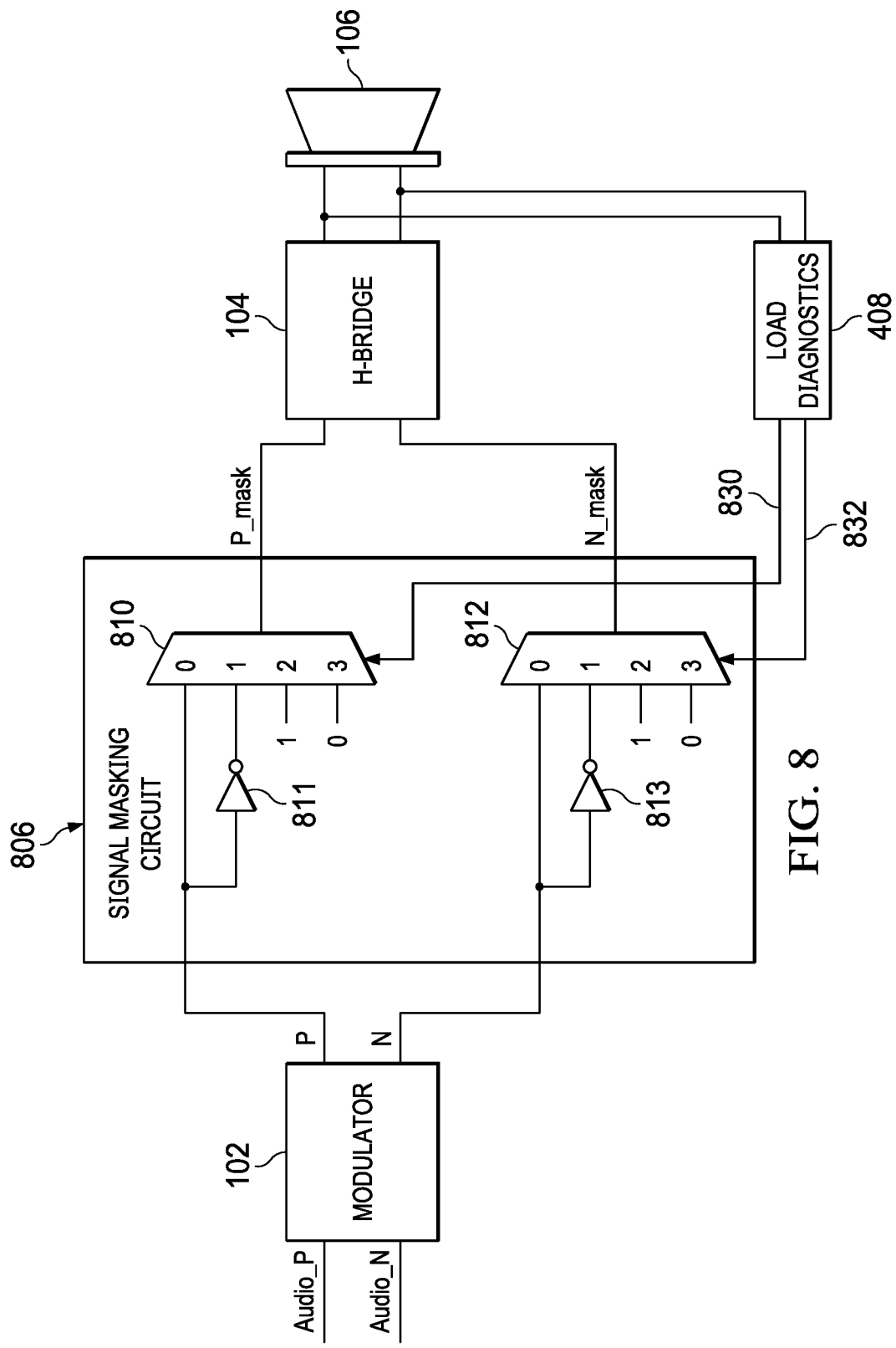
FIG. 8 illustrates an implementation of an audio system that includes a signal masking circuit.

FIG. 8 shows another implementation of an audio system 800 in which a signal masking circuit 806 is provided between the modulator 102 and the H-bridge 104. The signal masking circuit 806 permits the P and N signals to be provided through to the H-bridge when no short-circuit is detected by the load diagnostics circuit 408, and force the P or N signal to be logic low or high (as described above) based on the particular short-circuit condition detected.

The signal masking circuit 806 includes multiplexers 810 and 812 and inverters 811 and 813. Each multiplexer 810, 812 in this example includes at least four inputs 0-3. The 0-input of multiplexer 810 is coupled to output of modulator 102 and receives the P signal. The P signal is inverted by inverter 811, whose output is coupled to the 1-input of multiplexer 810. The 2- and 3-inputs of multiplexer 810 are connected to logic high (1) and low (0), respectively. The 0-through 3-inputs of multiplexer 812 are similarly configured for the N signal. The N signal from modulator 102 is provided to the 0-input of multiplexer 812. The logical inverse of the N signal is provided to the 1-input via inverter 813, and logic high and low are provided to the 2- and 3-inputs of multiplexer 812, respectively.

As explained above, the load diagnostics circuit 408 detects the four possible short-circuit conditions on the output of H-bridge 104 (OUTP shorted to the supply voltage terminal, OUTP shorted to ground, OUTM shorted to the supply voltage terminal, and OUTM shorted to ground). Control signals 830 and 832 encode the four possible short-circuit conditions and are used as the selection signals to the multiplexers. For example, if OUTP is shorted to ground, then control signal 830 causes multiplexer 810 to select its 3-input, which is logic low (0). The output of multiplexer 810 is labeled P_MASK and the output of multiplexer 812 is labeled N_MASK. Whereas in the example of FIG. 4, the P and N signals control the H-bridge 104 directly, in the example of FIG. 8, the P_MASK and N_MASK signals instead control the H-bridge 104.

Figure 9:
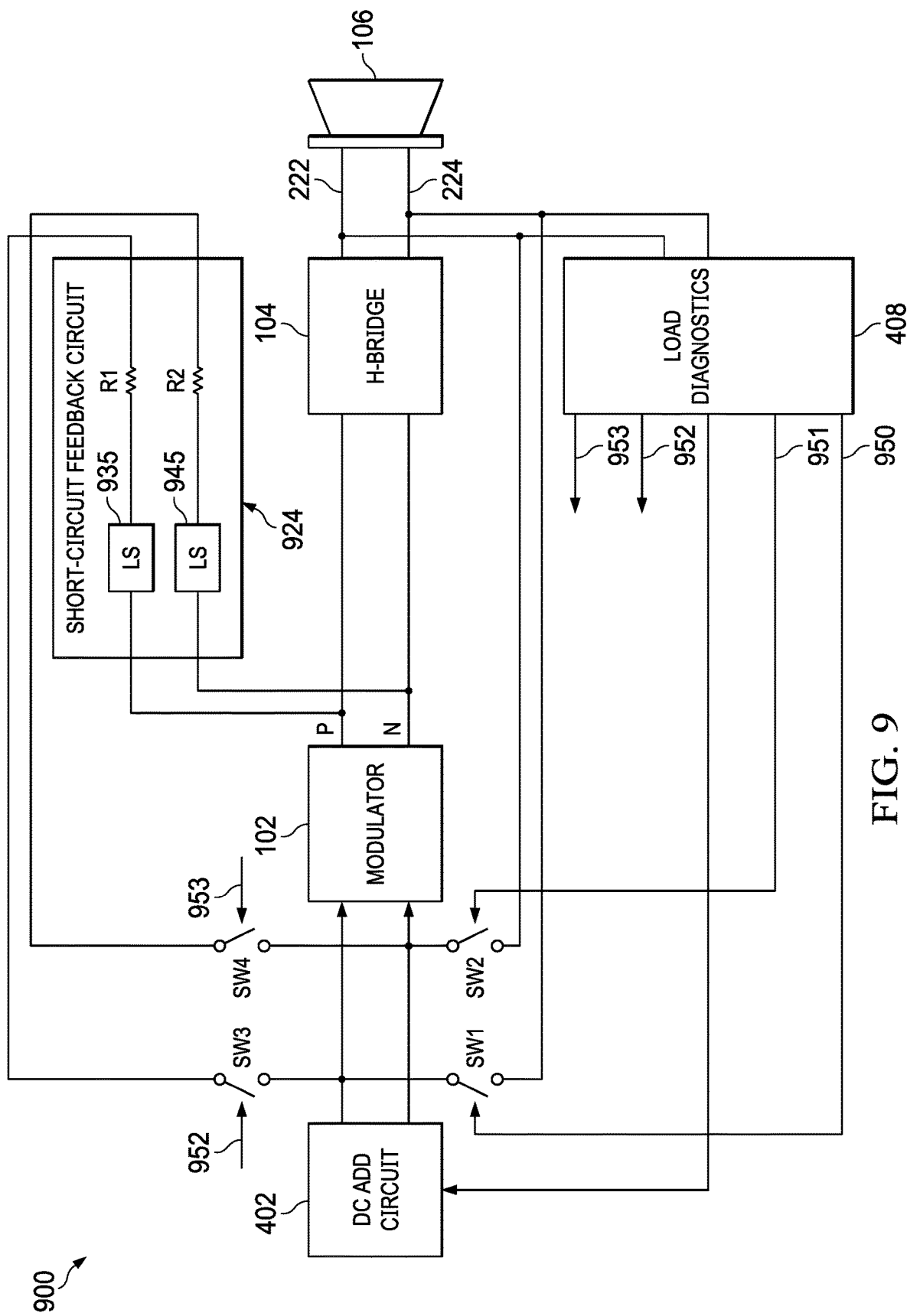
FIG. 9 illustrates an example of an audio system that includes a dummy feedback loop.

Referring to FIG. 9, an illustration of an audio system 900 including a short-circuit feedback circuit 924 in a feedback loop. The audio system 900 includes the DC add circuit 402, modulator 102, H-bridge 104, speaker 106, and load diagnostics circuit 408. The short-circuit feedback circuit 924 includes a level shifter (LS) 925 coupled to a resistor R1 provided in the P signal line. Similarly, the short-circuit feedback circuit 924 includes a level shifter (LS) 945 coupled to a resistor R2 provided in the N signal line.

With no output short-circuit conditions, the output DC is equal to the input DC. That is, the DC level at the output nodes 222 and 224 is equal to the DC voltage level of the input audio signal, which with no short-circuit condition the input DC is 0V. However, if output node 222 or 224 is shorted to the supply voltage node 210 or ground 212, the output DC will no longer be approximately equal to the input DC thereby causing the modulator to saturate (either 0% or 100% duty cycle). To address this potential problem, the load diagnostics circuit 408 generates control signals 950-953 to switches SW1-SW4. SW1 and SW2 operationally couple respective output nodes 224 and 222 to inputs of the modulator 102, and SW3 and SW4 operationally couple the short-circuit feedback circuit 924 (resistors R1 and R2, respectively) to the inputs of the modulator 102 as shown. The output impedance of short-circuit feedback circuit 924 is higher (e.g., 10× to 100× higher) than the output impedance of H-bridge 104. For example, the output impedance of H-bridge 104 may be approximately 200 milliohms and the output impedance of the short-circuit feedback circuit 924 may be approximately 50 ohms.

Responsive to OUTP being shorted to the supply voltage node or ground, the load diagnostics circuit 408 asserts control signals 951 and 952 to cause SW2 to open and SW3 to close. As such, instead of OUTP from H-bridge 104 being fed back to the input of modulator 102, the feedback signal is provided to the modulator's input from the short-circuit feedback circuit 924 (via resistor R1). Similarly, responsive to OUTM being shorted to the supply voltage node or ground, the load diagnostics circuit 408 asserts control signals 950 and 953 to cause SW1 to open and SW4 to close. As such, instead of OUTM from H-bridge 104 being fed back to the input of modulator 102, the feedback signal is provided to the modulator's input from the short-circuit feedback circuit 924 (via resistor R2). In another implementation, both SW1 and SW2 can be open and SW3 and SW4 closed in the case of a short-circuit fault detection. The voltages produced by the level-shifters 935, 945 and the value of the resistances of R1 and R2 are application-specific and are set so that the DC level of the output from the short-circuit feedback circuit 924 is approximately equal to the DC level of the audio input signal.

Figure 10:
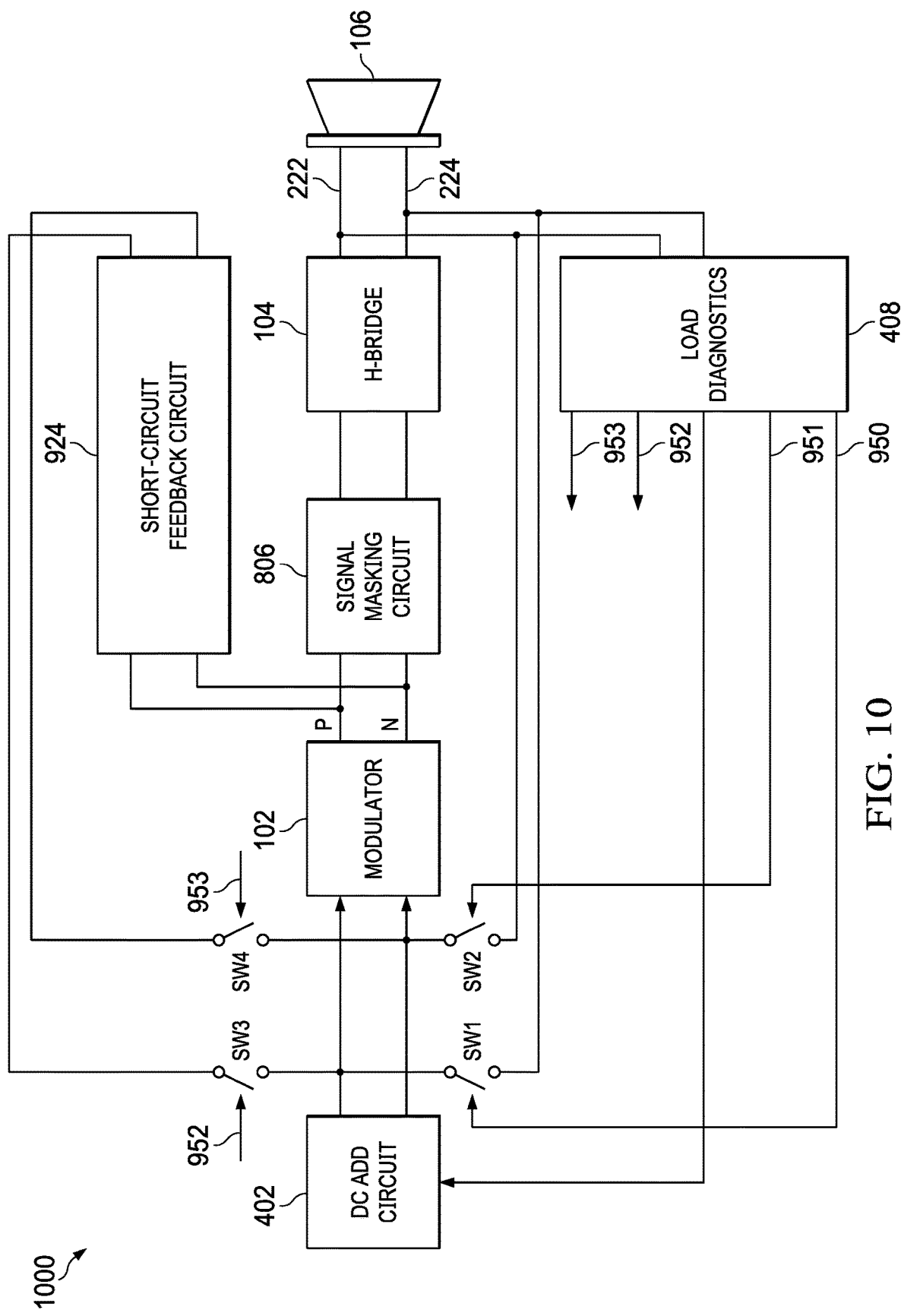
FIG. 10 illustrates an example of an audio system that includes a DC add circuit, a signal masking block, and a dummy feedback loop.

Various aspects of the above-described audio systems may be combined. For example, FIG. 10 depicts an example of an audio system 1000 that includes modulator 102, DC add circuit 402, short-circuit feedback circuit 924, and signal masking circuit 806. Accordingly, in response to detecting a short circuit on an output of H-bridge 104, the audio system 1000 may be configured to prevent a particular transistor within the H-bridge 104 from turning on by adding (via DC add circuit 402) a positive or negative DC value to the audio signal, to block (via signal masking circuit 806) an output signal from the modulator (e.g., force P or N high or low as described above), and/or to apply a feedback voltage from the short-circuit feedback circuit 924.

FIG. 11 shows an example implementation of the load diagnostics circuit 408. The load diagnostics circuit 408 includes logic circuit 1110 and current sources 1101-1104. Current sources 1101 and 1102 are coupled to the output node 222 of the H-bridge, and current sources 1103 and 1104 are coupled to the output node 224 of the H-bridge. Each current source can be independently turned on and off by the logic circuit 1110. A short-circuit detection test is performed by the logic circuit 1110 when the transistors 202-208 of the H-bridge are turned off. The short-circuit detection test can be performed at system startup or during run-time when no audio is being played through the speaker.

The speaker 106 has a resistance designated as Rspkr in FIG. 11. A current forced through the speaker will result in a certain voltage across the speaker's terminals based on the size of Rspkr. In this example, the current produced by each of the four current sources 1101-1104 is I. In one example, the short-circuit detection test is performed in two steps. First, current sources 1101 and 1104 are turned on, with current sources 1102 and 1103 off. Then, current sources 1102 and 1103 are turned on, with current sources 1101 and 1104 off.

With current sources 1101 and 1104 on, current I will flow from current source 1101, through Rspkr, and to ground through current source 1104. In the absence of a short-circuit on either of output nodes 222 or 224, the current through Rspkr will be I. Thus, the differential voltage (Vdiff) across Rspkr will be I*Rspkr. Both and I and Rspkr are known apriori, and thus Vdiff will be within a predicted voltage range in the absence of a short-circuit condition. The common mode voltage (VCM) between output nodes 222 and 224 will be (V222+V224)/2, where V222 is the voltage on output node 222 relative to ground and V224 is the voltage on output node 224 relative to ground. With no short-circuit, VCM is PVDD/2.

However, and still with current sources 1101 and 1104 on, if output node 222 is shorted to ground, then V222 will be 0 V (due to the short-circuit) and V224 will be 0 V due to current source 1104 being and having a relatively small voltage drop from ground to output node 224. In this stage (output node 222 shorted to ground), both Vdiff and VCM will be approximately equal to 0 V. Instead of output node 222 being shorted to ground, if output node 224 is shorted to PVDD, V224 will be equal to PVDD due the short-circuit and V222 will be approximately equal PVDD due to current source 1101 being on. In this latter case (short between output node 224 and PVDD), Vdiff will be equal to 0 V and VCM will be equal to PVDD. As such, with current sources 1101 and 1104 being, a short-circuit can be detected from output node 222 to ground or form output node 224 to PVDD.

The other short-circuit conditions are output node 222 being shorted to PVDD and output node 224 shorted to ground. If output node 222 is shorted to PVDD and current sources 1101 and 1104 are on, output node 222's voltage will be PVDD due to the short-circuit. Current I will flow through Rspkr and thus Vdiff will equal I*Rspkr. The voltage on output node 224 will equal PVDD−I*Rspkr, and thus VCM will equal (PVDD+PVDD−I*Rspkr)/2 which equals PVDD−I*Rspkr/2. If output node 224 is shorted to ground, current I will flow through Rspkr and Vdiff will equal I*Rspkr, and VCM will equal I*Rsprk/2.

A similar analysis can be performed if current sources 1102 and 1103 are on (and current sources 1101 and 1104 are off). Table I lists the various short-circuit conditions and the resulting differential and common mode voltages based on which pair of current sources are on.

TABLE I

| Condition | Current sources 1101 and 1104 on | | Current sources 1102 and 1103 on | |
| --- | --- | --- | --- | --- |
| | Vdiff | VCM | Vdiff | VCM |
| No short | I*Rspkr | PVDD/2 | −I*Rspkr | VDD/2 |
| 222 short to PVDD | I*Rspkr | PVDD − I*Rsprk/2 | 0 | PVDD |
| 222 short to gnd | 0 | 0 | −I*Rspkr | I*Rsprk/2 |
| 224 short to PVDD | 0 | PVDD | −I*Rspkr | PVDD − I*Rsprk/2 |
| 224 short to gnd | I*Rspkr | I*Rsprkr/2 | 0 | 0 |
| Open Load | PVDD | PVDD/2 | −PVDD | PVDD/2 |

The logic circuit 1110 monitors the voltages on output nodes 222 and 224 when current sources 1101 and 1104 are on and again when current sources 1102 and 1103 are on. Based on the voltages and as explained above, the logic circuit 1110 can detect whether a short-circuit is present and the type of short-circuit (output node 222 shorted to PVDD or to ground; output node 224 shorted to PVDD or to ground).

Any of the examples described herein can be implemented on an integrated circuit. For example, each of the examples shown in FIGS. 1 (except for the speaker), 4, 5, 8, 9, and 10 can be fabricated as integrated circuits.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An audio system, comprising:
a modulator having an input and an output;
an H-bridge having an input and an output, the output of the modulator coupled to the input of the H-bridge;
a load diagnostics circuit having an input and a first control output wherein the load diagnostics circuit is configured to detect a short-circuit condition on the output of the H-bridge; and
a direct current (DC) add circuit having an input and an output, the output of the DC add circuit is coupled to the input of the modulator, and the first control output from the load diagnostics circuit is coupled to the DC add circuit.

2. The audio system of claim 1, wherein the DC add circuit is configured to receive an audio input signal on its input and to selectively add DC to the audio input signal in response to a control signal on the first control output from the load diagnostics circuit.

3. The audio system of claim 2, wherein the load diagnostics circuit in response to detecting a short-circuit condition asserts the control signal to the DC add circuit.

4. The audio system of claim 2, wherein:
the output of the H-bridge includes a first output terminal and a second output terminal; and
the load diagnostics circuit is configured to selectively detect a type of short-circuit on the output of the H-bridge, the type including the first output terminal being shorted to a power supply voltage terminal, the first output terminal being shorted to a ground, the second output terminal being shorted to the power supply voltage terminal, or the second output terminal being shorted to ground.

5. The audio system of claim 4, wherein the load diagnostic circuit is configured to assert the control signal based on the detected type of short-circuit, and the DC add circuit is configured to selectively add a positive DC value to the audio input signal responsive to a first state of the control signal or add a negative DC value to the audio input signal responsive to a second state of the control signal.

6. The audio system of claim 1, further including a signal masking circuit coupled between the modulator and the H-bridge.

7. The audio system of claim 6, wherein:
the load diagnostics circuit includes a second control output;
the signal masking circuit includes a control input coupled to the second control output;
the input of the H-bridge includes a first H-bridge input and a second H-bridge input;
the signal masking circuit is configured to force a signal on one of the first and second H-bridge inputs to a fixed logic state responsive to a control signal on the load diagnostic circuit's second control output.

8. An audio system, comprising:
a modulator having an input and an output;
an H-bridge having an input and an output;
a load diagnostics circuit having an input and a first control output; and
a signal masking circuit coupled between the output of the modulator and the input of the H-bridge, the signal masking circuit including a control input coupled to the first control output of the load diagnostics circuit;
wherein the input of the H-bridge includes a first H-bridge input and a second H-bridge input; and
the signal masking circuit is configured to force a signal on one of the first and second H-bridge inputs to a fixed logic state responsive to a control signal on the load diagnostic circuit's first control output;
wherein the output of the modulator includes a first modulator output and a second modulator output, and wherein the signal masking circuit includes:
a first multiplexer having first through third inputs and a first selection input, the first input of the first multiplexer coupled to the first modulator output, the second input of the first multiplexer configured to receive a fixed logic high, the third input of the first multiplexer configured to receive a fixed logic low, and the first selection input coupled to the first control output of the load diagnostics circuit; and a second multiplexer having first through third inputs and a second selection input, the first input of the second multiplexer coupled to the second modulator output, the second input of the second multiplexer configured to receive a fixed logic high, the third input of the second multiplexer configured to receive a fixed logic low, and the second selection input coupled to the first control output of the load diagnostics circuit;

the input of the H-bridge includes a first H-bridge input and a second H-bridge input.

9. The audio system of claim 8, wherein the input of the H-bridge includes a first H-bridge input and a second H-bridge input, and wherein an output of the first multiplexer coupled to the first H-bridge input and an output of the second multiplexer is coupled to the second H-bridge input.

10. An audio system, comprising:
a modulator having an input and an output;
an H-bridge having an input and an output;
a load diagnostics circuit having an input and a first control output;
a signal masking circuit coupled between the output of the modulator and the input of the H-bridge, the signal masking circuit including a control input coupled to the first control output of the load diagnostics circuit; and
a direct current (DC) add circuit having an input and an output, the output of the DC add circuit is coupled to the input of the modulator, and a second control output from the load diagnostics circuit is coupled to the DC add circuit, the DC add circuit is configured to add, responsive to a signal on the second control output form the load diagnostic circuit, a DC value to an input signal on the input of the DC add circuit;
wherein the load diagnostics circuit is configured to detect a short-circuit condition on the output of the H-bridge and, in response, to assert control signal on the first and second control outputs.

11. An audio system, comprising:
a modulator having an input and an output;
an H-bridge having an input and an output;
a load diagnostics circuit having an input and a first control output;
a signal masking circuit coupled between the output of the modulator and the input of the H-bridge, the signal masking circuit including a control input coupled to the first control output of the load diagnostics circuit; and a short-circuit feedback circuit having an input and an output, the input of the short-circuit feedback circuit coupled to the output of the modulator; and a first switch coupled between the output of the short-circuit feedback circuit and the input of the modulator; and a second switch coupled between the output of the H-bridge and the input of the modulator;

wherein the first and second switches are configured to change their operational state based on control signals from the load diagnostics circuit.

12. The audio system of claim 11, wherein the H-bridge has an output impedance and the short-circuit feedback circuit has an output impedance, and the output impedance of the short-circuit feedback circuit is greater than the output impedance of the H-bridge.

13. An audio system, comprising:
a modulator having an input and an output;
an H-bridge having an input and an output;
a short-circuit feedback circuit having an input and an output, the input of the short-circuit feedback circuit coupled to the output of the modulator; and
a first switch coupled between the output of the short-circuit feedback circuit and the input of the modulator;
a second switch coupled between the output of the H-bridge and the input of the modulator;
a load diagnostics circuit having an input coupled to the output of the H-bridge, the load diagnostics circuit configured to control operational states of the first and second switches; and
a signal masking circuit coupled between the output of the modulator and the input of the H-bridge, the signal masking circuit including a control input coupled to a control output of the load diagnostics circuit.

14. The audio system of claim 13, wherein the load diagnostics circuit is configured to detect a short-circuit on the output of the H-bridge and, in responsive to the detected short-circuit, open the second switch and close the first switch.

15. The audio system of claim 13, further including:
a direct current (DC) add circuit having an input and an output, the output of the DC add circuit is coupled to the input of the modulator, and a control output from the load diagnostics circuit is coupled to the DC add circuit, the DC add circuit is configured to add, responsive to a signal on the control output form the load diagnostic circuit, a DC value to an input signal on the input of the DC add circuit.

16. The audio system of claim 15, wherein the DC add circuit is configured to selectively add a positive or negative DC value to the input signal on the input of the DC add circuit based on the signal on the control output form the load diagnostic circuit.

* * * * *